United States Patent [19]

Yazaki et al.

[11] Patent Number: 4,599,297
[45] Date of Patent: Jul. 8, 1986

[54] METHOD OF MANUFACTURING PRINTED BOARDS

[75] Inventors: Yoshio Yazaki, Chofu; Shinya Ogawa, Tokyo, both of Japan

[73] Assignee: ORC Manufacturing Co., Ltd., Tokyo, Japan

[21] Appl. No.: 448,245

[22] Filed: Dec. 9, 1982

[30] Foreign Application Priority Data

Dec. 10, 1981 [JP] Japan .................. 56-199106

[51] Int. Cl.[4] .......................................... G03C 11/12
[52] U.S. Cl. ........................ 430/256; 430/260; 430/320; 430/322; 430/325; 430/326; 430/327; 430/329; 430/331; 156/236; 156/238
[58] Field of Search ............... 430/260, 271, 313, 320, 430/322, 331, 325, 326, 258, 259, 256; 156/236, 238, 302, 629, 630

[56] References Cited

U.S. PATENT DOCUMENTS

| | | | |
|---|---|---|---|
| 2,570,627 | 10/1951 | Albin | 354/299 |
| 3,469,982 | 9/1969 | Celeste | 430/256 |
| 3,547,730 | 12/1970 | Cohen et al. | 156/345 |
| 3,629,036 | 12/1971 | Isaacson | 156/241 |
| 4,075,051 | 2/1978 | Brzozowski | 156/236 |
| 4,214,936 | 7/1980 | Del Bianco | 156/302 |
| 4,233,395 | 11/1980 | Klüpfel et al. | 430/271 |

Primary Examiner—John E. Kittle
Assistant Examiner—José G. Dees
Attorney, Agent, or Firm—Fidelman, Wolffe & Waldron

[57] ABSTRACT

At least one strip of dry film assembly is supplied continuously to a plurality of mutually spaced apart boards which are also being fed continuously. The film assembly consists of a photosensitive layer sandwiched between a protective film and a base. The base is removed from the assembly when the assembly is supplied to the boards, so that each of the boards may be bonded to the photosensitive layer. The boards and the film assembly are fed intermittently, and the photosensitive layer is exposed to light to print a predetermined pattern on each board. The protective film is removed from the film assembly, and each printed board is subjected to developing treatment.

5 Claims, 5 Drawing Figures

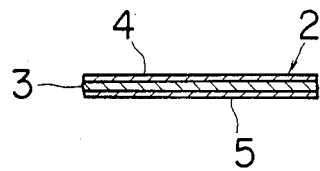
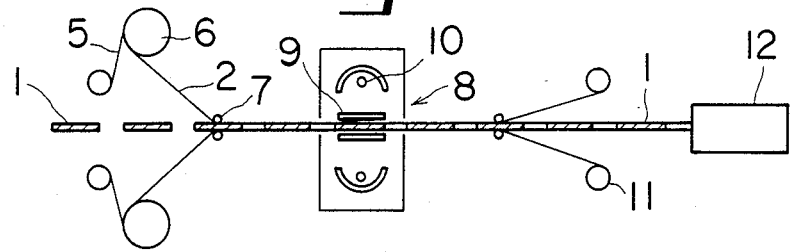
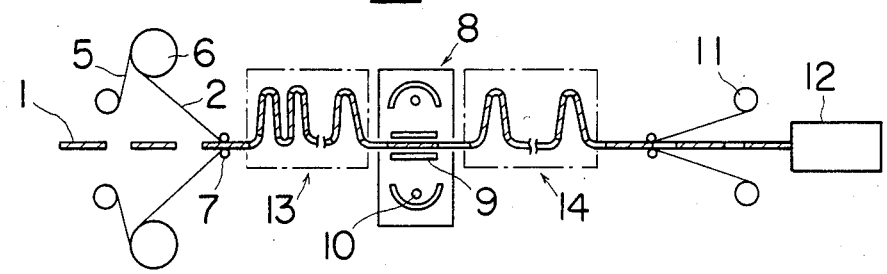
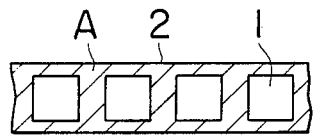 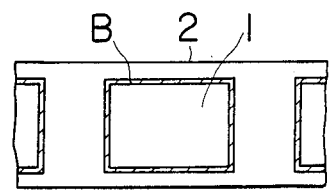

METHOD OF MANUFACTURING PRINTED BOARDS

BACKGROUND OF THE INVENTION

1. Field of the Invention

This invention relates to a method of manufacturing printed boards.

2. Description of the Prior Art

A conventional method of manufacturing printed boards comprises attaching a dry film to a printed board, cutting away any dry film portion projecting from the board manually or otherwise, exposing the dry film through a pattern mask, removing a protective film from the dry film, and developing the dry film. This method is, however, very inefficient, and requires a lot of time, since the step of cutting away the dry film portion projecting from the board interrupts the operation of a manufacturing line. A more serious problem which the conventional method involves is due to the possibility that fine chips of the dry film, dust produced when the edges of the board are ground, etc. may adhere to the dry film. These chips and dust are likely to shield light from a pattern on the printed board during exposure, since the pattern, such as of an integrated circuit, is extremely small.

The dry film is composed of a protective film and a photosensitive layer. The protective film is removed after the dry film has been attached to the printed board, and exposed to light. The removal of the protective film from each of a lot of boards is a highly time-consuming job.

SUMMARY OF THE INVENTION

It is an object of this invention to provide a method which overcomes the drawbacks of the prior art as hereinabove pointed out, and facilitates the production of printed boards which are free from any defect.

According to this invention, a method of manufacturing printed boards comprises attaching a plurality of spaced apart boards one after another to a dry film traveling intermittently, exposing the photosensitive layer of the dry film facing each board to light in a predetermined pattern, removing a protective film from the dry film, and developing the dry film.

As a strip of dry film travels intermittently, the application of the boards to the dry film, exposure, removal of the protective film and development are carried out smoothly in a continuous line. The method of this invention, thus, enables the production of very good printed boards efficiently by saving a lot of time and labor.

BRIEF DESCRIPTION OF THE DRAWINGS

FIG. 1 is a fragmentary cross sectional view of a dry film assembly;

FIG. 2 is a front elevational view showing schematically an apparatus for carrying out the method of this invention;

FIG. 3 is a view similar to FIG. 2, but showing another embodiment of this invention; and FIGS. 4 and 5 are top plan views showing means for exposure.

DETAILED DESCRIPTION OF THE INVENTION

The method of this invention starts with attaching a dry film assembly 2 to a board 1. The dry film assembly 2 is composed of a photosensitive layer 3 and a protective film 4 attached to one surface of the photosensitive layer 3. It comprises a strip wound in a roll 6 with a film base 5 attached to the other surface of the photosensitive layer 3 as shown in FIG. 1.

The base 5 is removed when the dry film assembly 2 is unwound from the roll 6. A plurality of boards 1 are supplied one after another in mutually spaced apart relationship by a belt conveyor, or the like. The dry film assembly 2 is closely attached to the boards 1 one after another under heat and pressure by hot rolls 7, or the like.

According to the arrangement shown in FIG. 2, the boards 1 are sandwiched between a pair of strips of dry film 2, and thereby fed through the apparatus. The dry film 2 and each board 1 carried thereby are stopped in an exposure device 8. A pair of pattern masks 9 are applied to the dry films 2, and the dry films 2 are exposed to radiation by a pair of ultraviolet lamps 10, whereby the photosensitive layers 3 are printed. The protective films 4 are removed from the dry film assemblies 2, and wound on a pair of pillars 11. The printed boards 1 are, then, conveyed by a pair of photosensitive layers 3, and fed continuously in mutually spaced apart relationship into a developing device 12.

According to this invention, the boards 1 are attached to the dry film strips 2, and directly fed to the exposure and developing devices. There is no necessity of separating the boards 1 from one another, or cutting away any extra dry film portion from the periphery of each board 1. There is, therefore, no interruption of the operation due to such separation or cutting. There is not produced any fine chip or dust of the dry film 2 or the boards 1. There is, therefore, no shielding of the pattern by any such chip or dust during exposure. The protective films 4 are removed in strip form by the pillars 11 before the boards 1 are delivered into the developing device 12. There is no need of removing the protective films individually from the boards, as they are detached continuously in strip form.

In order to ensure that the boards 1 and the dry film strips 2 adapt themselves to each other both physically and chemically after they have been bonded together by the hot rolls 7, it is necessary to leave the board and dry film assembly for a considerably long time of, say 15 to 30 minutes before it is fed into the exposure device. Since the assembly is in the form of a strip, however, a large space is required to allow it to travel for such a long time.

Another embodiment of this invention is, therefore, shown in FIG. 3 to provide a solution to the problem as hereinabove pointed out. A holding device 13 is provided between the hot rolls 7 and the exposure device 8 to allow the board and dry film assembly to travel at a predetermined speed along a vertically zigzag path.

Each board 1 printed in a predetermined pattern in the exposure device 8 has to be left for a certain length of time in the range of, say, 15 to 30 minutes for the chemical stabilization of the printed pattern prior to its delivery into the developing device 12. This also gives rise to the problem of the space. Therefore, FIG. 3 shows another holding device 14 provided between the exposure device 8 and the developing device 12 for allowing the printed board and dry film assembly to travel at a predetermined speed along a vertically zigzag path.

While the exposure device 8 is essentially required to expose the photosensitive layers facing each board 1 to be printed, the rest of the photosensitive layers 3 may be exposed to light either wholly or partly. FIG. 4 shows an arrangement in which only the photosensitive layers facing the boards 1 are exposed to light, while the remaining area marked at A by oblique lines is not exposed. On the other hand, FIG. 5 shows an arrangement in which only a narrow area B surrounding each board 1 is left unexposed, while the remaining area is totally exposed. These different modes of exposure have a significant bearing on the developing treatment by the developing device 12. The treatment of the board and film assembly by the developing device 12 begins with the dissolution of the unexposed photosensitive layers 3 by a developing solution. As is obvious from the comparison of FIGS. 4 and 5, the assembly shown in FIG. 4 has a larger area to be dissolved, and is more likely to deteriorate the developing solution, than the assembly of FIG. 5. According to the arrangement shown in FIG. 5, it is only the limited areas B that have to be dissolved. In either event, the boards 1 are separated individually from the photosensitive layers when the unexposed portions of the latter have been dissolved. The film 2 of FIG. 5 having a substantial exposed, and therefore, undissolved portion can be easily removed and wound into a roll for later disposal.

What is claimed is:

1. A method of manufacturing printed boards, comprising the steps of:
    providing a dry film assembly consisting of a continuous web-like photosensitive layer sandwiched between a protective film and a base;
    supplying a plurality of boards to a loading station;
    removing said base and feeding at least one continuous strip of said dry film assembly through said loading station and bonding each of said boards to said photosensitive layer in a spaced apart relation;
    conveying said spaced apart boards from said loading station through an exposing station via attachment to said photosensitive layer, said photosensitive layer being fed intermittently;
    exposing selected portions of said photosensitive layer to light at said exposing station while masking particular portions of said photosensitive layer from said exposing, said particular portions comprising a narrow band around a periphery of each of said boards;
    conveying said boards attached to said photosensitive layer from said exposing station to a developing station while removing said protective film from said photosensitive layer;
    developing said boards to provide said printed boards; and
    removing said boards from said conveying means by dissolving said particular portions of said photosensitive layer during said developing, whereby deterioration of a developing solution by the dissolving masked portions is minimized, resulting in longer processing times per batch of developing solution.

2. A method as set forth in claim 1, and further comprising the steps of:
    causing said film assembly carrying said boards thereon to travel at a predetermined speed along a zigzag path before and after said photosensitive layer is exposed to light, such that a processing space for said method is minimized.

3. A method as in claim 1, and further comprising the step of:
    disposing of a remaining portion of said photosensitive layer by winding, said remaining portion being outside of said narrow areas.

4. A method as in claim 1, wherein said feeding of a continuous strip of said photosensitive layer is effected by the step of:
    reeling one end of said protective film while unreeling another end of said protective film.

5. A method as in claim 1, and further comprising the step of:
    feeding another strip of said dry film assembly in order to sandwich and convey said spaced apart boards from said loading station to said developing station via two photosensitive layers while processing both sides of said boards.

* * * * *